US006496033B2

(12) United States Patent
Rees

(10) Patent No.: US 6,496,033 B2
(45) Date of Patent: *Dec. 17, 2002

(54) UNIVERSAL LOGIC CHIP

(75) Inventor: David B. Rees, Hants (GB)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/326,804

(22) Filed: Jun. 4, 1999

(65) Prior Publication Data

US 2001/0043081 A1 Nov. 22, 2001

Related U.S. Application Data

(60) Provisional application No. 60/088,407, filed on Jun. 8, 1998.

(51) Int. Cl.[7] .................................................. G06F 7/38
(52) U.S. Cl. ............................................ 326/38; 326/82
(58) Field of Search ............................. 326/38, 37, 47, 326/105, 82

(56) References Cited

U.S. PATENT DOCUMENTS

| 4,472,647 A | 9/1984 | Allgood et al. ............. 307/475 |
| 4,698,526 A | 10/1987 | Allan .......................... 307/475 |
| 4,877,978 A | 10/1989 | Platt ........................... 307/473 |
| 4,896,060 A | 1/1990 | Ma ........................... 307/482.1 |

(List continued on next page.)

FOREIGN PATENT DOCUMENTS

| EP | 0315473 | 11/1988 | ......... H03K/19/094 |

OTHER PUBLICATIONS

"A 3.3–V Programmable Logic Device that Addresses Low Power Supply and Interface Trends", by R. Patel, W. Wong, J. Lam, T. Lai, T. White and S. Cheung, IEEE 1997 Custom Integrated Circuits Conference, pp. 25.2.1 through 25.5.4.
"A 3/5 V Compatible I/O Buffer", by M.J.M. Pelgrom and E.C. Dijkmans, IEEE Journal of Solid–State Circuits, vol. 30, No. 7, Jul. 1995, pp. 823 through 825.
"A 3.3V ASIC for Mixed Voltage Applications With Shut Down Mode", by Makoto Ueda et al., IEEE 1993 Custom Integrated Circuits Conference, pp. 25.5.1 through 25.5.4.
Mano, *Computer Engineering: Hardware Design*, Pretice Hall: Englewood Cliffs, NJ, pp. 96–99, 1998.

*Primary Examiner*—David Nelms
*Assistant Examiner*—Gene N. Auduong
(74) *Attorney, Agent, or Firm*—Christopher P. Maiorana, P.C.

(57) ABSTRACT

An integrated circuit or chip having a number of bond pads or inputs that may or may not have a bond wire connecting the pad to a supply voltage, ground or via a package pin to an external input when the chip is placed in the package. The circuits such as the input buffer connected to the pad are normally biased in the opposite voltage to that which the bond wire may be connected. For example, the input buffer circuitry connected to the bond pad, may see the pad as being connected to ground if the bond wires are connected, otherwise the input buffer circuitry will see the pad as being connected to VCC. When the pad is connected to a package pin then the end user may apply an electrical signal (e.g., supply voltage or ground) so that the integrated circuit may be configured as any one of a number of possible devices having one of a set of electrical attributes. Typically, the chip will have up to 8 such pads which can be used individually or in combination to configure the device. In one example, the chip would be part of an existing 'family' of chips which all have, for example, N package pins. The extra package pins used to configure the chip would be added to one or both ends of the package so that the rest of the package looks like a normal non-configurable member of the 'family'.

18 Claims, 2 Drawing Sheets

U.S. PATENT DOCUMENTS

| | | | |
|---|---|---|---|
| 4,902,917 A | 2/1990 | Simpson | 307/465 |
| 4,930,112 A | 5/1990 | Tanaka et al. | 365/226 |
| 4,978,905 A | 12/1990 | Hoff et al. | 323/314 |
| 5,084,635 A | 1/1992 | Toda et al. | 307/465 |
| 5,144,167 A | 9/1992 | McClintock | 307/475 |
| 5,153,450 A | 10/1992 | Ruetz | 307/443 |
| 5,157,282 A | 10/1992 | Ong et al. | 307/443 |
| 5,161,124 A | 11/1992 | Love | 361/222 |
| 5,162,672 A | 11/1992 | McMahan et al. | 307/443 |
| 5,300,832 A | 4/1994 | Rogers | 307/475 |
| 5,309,044 A * | 5/1994 | Wang | 326/124 |
| 5,345,112 A | 9/1994 | Nazarian et al. | 307/443 |
| 5,353,250 A | 10/1994 | McAdams | 365/189.03 |
| 5,359,240 A | 10/1994 | Sandhu | 307/451 |
| 5,402,018 A | 3/1995 | Koyanagi | 327/23 |
| 5,406,139 A | 4/1995 | Sharpe-Geisler | 326/71 |
| 5,600,267 A | 2/1997 | Wong et al. | 326/73 |
| 5,732,027 A | 3/1998 | Arcoleo et al. | 365/189.05 |
| 6,047,352 A * | 4/2000 | Lakhani et al. | 711/5 |

\* cited by examiner

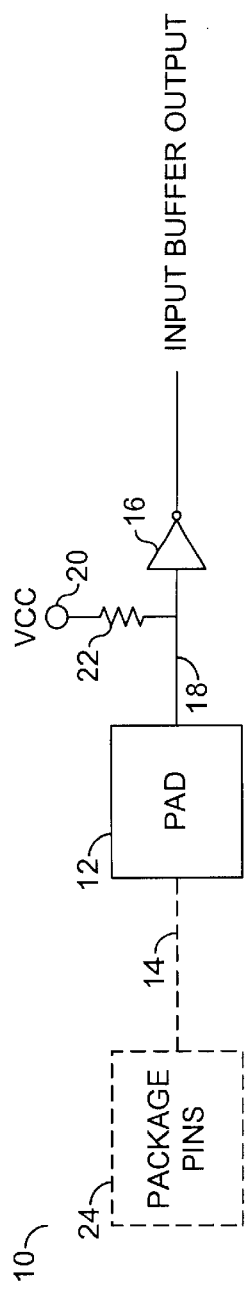
FIG. 1
(CONVENTIONAL)

UNIVERSAL LOGIC CHIP

This application claims the benefit of U.S. Provisional Application No. 60/088,407, filed Jun. 10, 1998 and is hereby incorporated by reference in its entirety.

FIELD OF THE INVENTION

The present invention relates to functionality of an integrated circuit and, more particularly, to selecting one of a set of possible functionalities or attributes of an integrated circuit chip via the connections to the chip.

BACKGROUND OF THE INVENTION

Conventional approaches to modifying the functionality of a chip or one of its attributes after fabrication include techniques such as burning through an element on the chip with a laser or a chemical means. However, conventional approaches generally must configure the chip prior to the completion of the packaging process (e.g., sealing the chip in its package).

Similarly, it may be desirable to change some part of the function of the chip such as by converting a simple buffer to a more complex register or to modify an electrical attribute of the chip (e.g., whether an input pin has bus-hold or not). In conventional approaches this type of modification is generally done by changing one or more of the actual interconnect layers of the chip so that the underlying transistors are connected in a different manner. This generally must be done during fabrication of the IC, and not by post-fabrication configuration.

In general, integrated circuits include pads that may be connected to bond wires that may electrically connect the chip to the pins of a package, lead frame or substrate on which the chip is mounted. A pad on an integrated circuit may or may not have a bond wire connecting the pad to a package pin which itself may be connected to a supply voltage (e.g., VCC) or ground or any other electrical signal.

Referring to FIG. 1, a package interconnection 10 is shown. The package interconnection 10 generally comprises a pad 12 on the chip, a bond wire 14, a package pin 24, an input buffer 16, a chip interconnect wire 18, a node 20 and a resistor 22. The circuitry (not shown) connected to the output of the input buffer 16 is normally biased in the opposite voltage to that which the bond wire 14 is connected via the package pin 24. For example, the circuitry connected to the output of the input buffer 16 may see the pad 12 as being connected to ground if the bond wire 14 is connected to a grounded package pin. Otherwise, the circuitry will see the pad as connected to the supply voltage VCC at the node 20. In general, such a technique may be used to select between two operational modes on the circuit. For example, the selection between the normal operating mode of the chip and a special operating mode (e.g., a testing mode) may result. Alternatively, bond pads may receive an external signal that selects between two different electrical operating modes of a chip. For example, the chip may have a chip enable mode which turns off the chip's output buffers.

Once the chip is packaged, the functionality and basic electrical attributes generally cannot be changed. As a result, the end user generally loses the ability to change the functionality or electrical attributes of the chip after the device is packaged. This, in turn, generally requires the end user (or their supplier) to maintain a sufficient inventory of parts to provide all of the desired chip functions (e.g., buffer, inverter, register, latch, etc.), or basic electrical attributes (e.g., power supply voltage may be 5v, 3.3v, 2.5v etc.).

SUMMARY OF THE INVENTION

The present invention concerns an integrated circuit or chip having a number of bond pads or inputs that may or may not have a bond wire connecting the pad to a supply voltage, ground or via a package pin to an external input when the chip is placed in the package. The circuits such as the input buffer connected to the pad are normally biased in the opposite voltage to that which the bond wire may be connected. For example, the input buffer circuitry connected to the bond pad, may see the pad as being connected to ground if the bond wires are connected, otherwise the input buffer circuitry will see the pad as being connected to VCC. When the pad is connected to a package pin then the end user may apply an electrical signal (e.g., supply voltage or ground) so that the integrated circuit may be configured as any one of a number of possible devices having one of a set of electrical attributes. Typically, the chip will have up to 8 such pads which can be used individually or in combination to configure the device. In one example, the chip would be part of an existing 'family' of chips which all have, for example, N package pins. The extra package pins used to configure the chip would be added to one or both ends of the package so that the rest of the package looks like a normal non-configurable member of the 'family'.

The objects, features and advantages of the present invention include a circuit and method that may change or determine the format, functionality, mode or electrical attributes of a device including three or more of the following attributes: (i) synchronous or asynchronous data transfer; (ii) registered or unregistered data transfer; (iii) one of a set of output drive strengths which may be balanced or unbalanced (e.g., +64 mA and −32 mA, or +24 mA, or +8 mA and −8 mA etc.), (iv) whether the inputs have 'bus hold' functionality or not and/or (v) one of $2^n$ functions for the chip (for example, selecting between a buffer and a register).

BRIEF DESCRIPTION OF THE DRAWINGS

These and other objects, features and advantages of the present invention will be apparent from the following detailed description and the appended claims and drawings in which:

FIG. 1 is a diagram illustrating typical bonding pads;

DETAILED DESCRIPTION OF THE PREFERRED EMBODIMENTS

Figure 2:
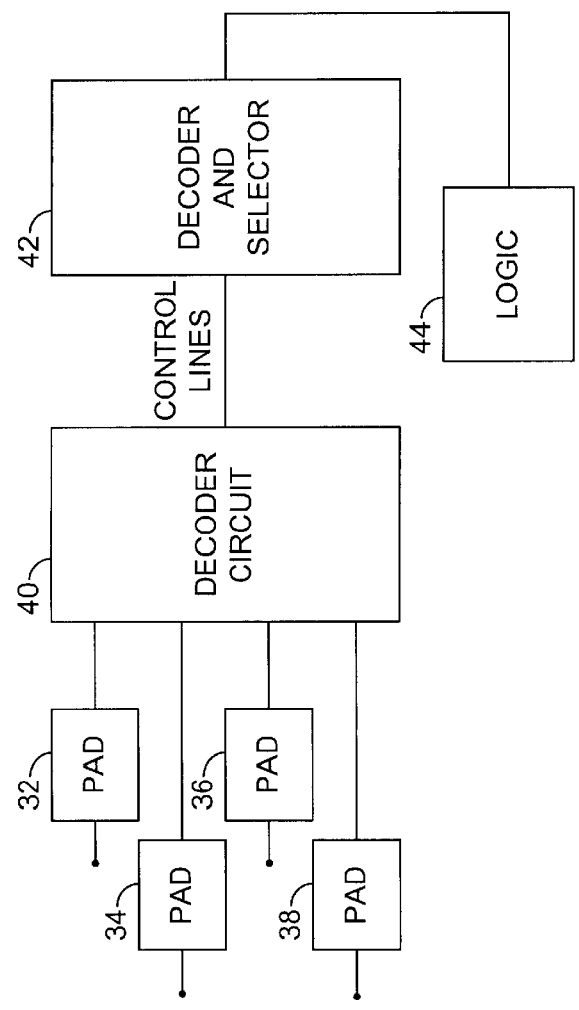
FIG. 2 is a block diagram of an integrated circuit chip illustrating bonding pads with the circuitry of the present invention.

Referring to FIG. 2, a block diagram of an example of function selecting circuitry that may be used with the present invention is shown illustrating bonding pads 32, 34, 36 and 38 connected to a pre-decoder circuit 40. The bonding pads 32–38 may be individually connected to package pins on the outside of the integrated circuit or chip, allowing selection of the chip functionality. Alternatively, the pads may not be bonded out, when they are expected to have an internal bias circuit to pull them to the power supply or ground, or may be bonded out to one of the package pins which is always used for the power supply or ground. The pre-decoder circuit 40 receives information from the bond pads 32–38 as inputs, and outputs partially decoded data to a decoder and selector circuit 42. An example of such a circuit is shown in co-pending application Ser. No. 08/579,853, filed on Dec. 26, 1995, which is hereby incorporated by reference in its entirety.

Figure 3:
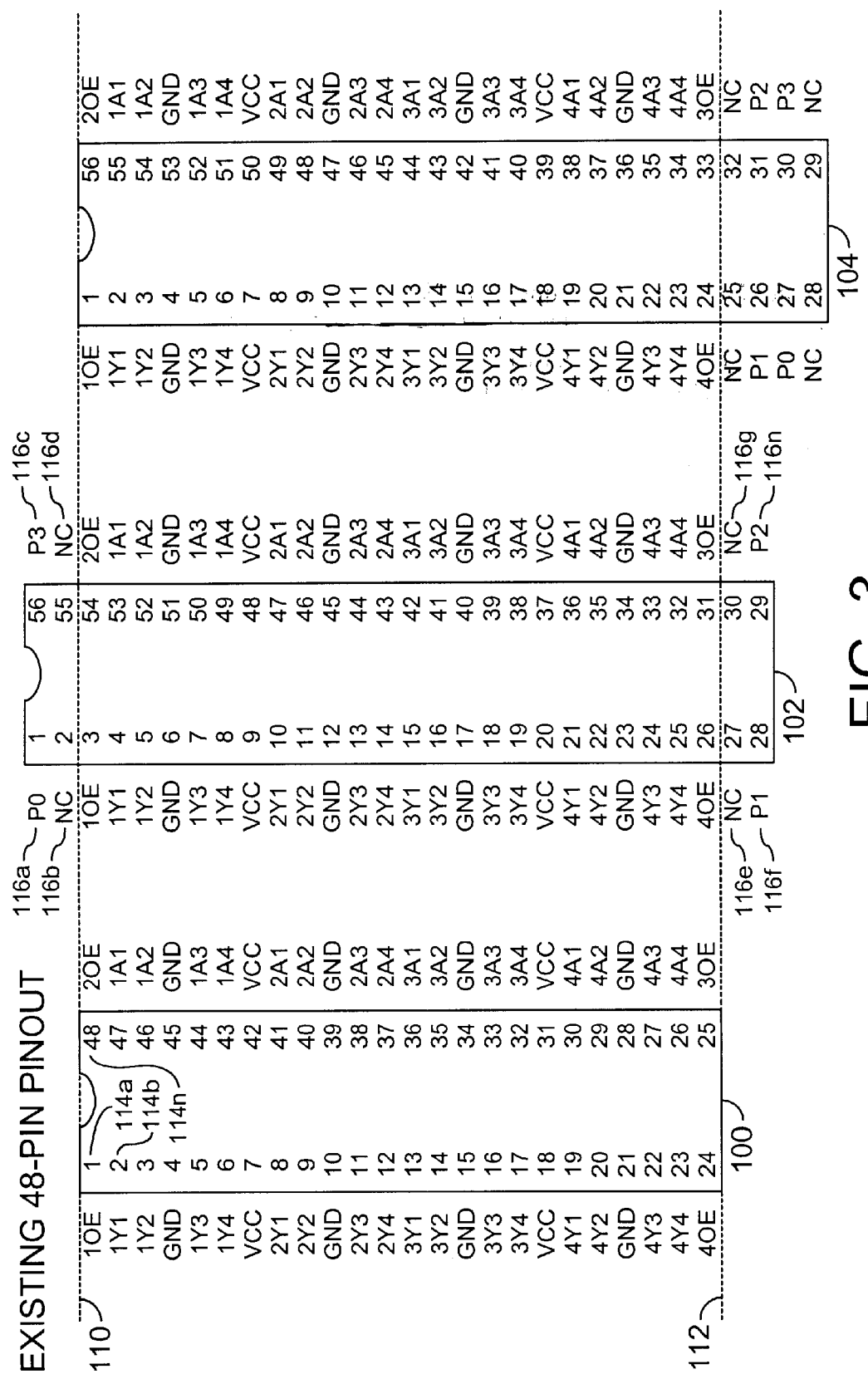
FIG. 3 is a block diagram of a circuit implementing the present invention.

Referring to FIG. 3, an example of a chip 100, a chip 102, and a chip 104 is shown. The chip 100 is shown having a number of pins 114a–114n, that are the normal inputs and outputs corresponding to the standard functionality of the chip 100. In contrast, the chip 102 has a number of pins 116a–116n (e.g., pin P0, P1, P2 and pin P3) in excess of those on the chip 100 (i.e., that are above the horizontal line 110 or below the horizontal line 112). As a result, if the circuit 102 is inserted into a socket of a printed circuit board (PCB), the pins between the horizontal lines 110 and 112 may provide a connection to the device in exactly the same way as the pins 114a–114n of chip 100, while the pins 116a–116n may provide inputs that may be used to configure the device. Similarly, the chip 104 has the majority of its pins between the horizontal line 110 and the horizontal line 112. However, the selectable function pins P0, P1, P2, and P3, the no-connect pins NC and the ground pins 28 and 29 below the horizontal line 112 are in excess of those shown for chip 100 and may also be used as configuration inputs. The no connect pins NC are shown for example only since they can also be used as additional configuration inputs. Configuration inputs may be connected to an external device, such as a microprocessor or microcontroller, that may present the signals that are used to configure the chip 100 or they can be connected to the power supply or the ground supply.

In another example, some of the excess "pins" (e.g., the configuration inputs) may be internally configured bond pads either not connected or connected via a bond wire to the chip supply or ground inside the package, rather than bond pads wired to external pins. The excess pins (e.g., pins P0–P3) may control certain attributes or functionality of the chips 102 and/or 104 while other attributes are internally configured. This selectability in attributes or functionality occurs even though the pins between the horizontal lines 110 and 112 are connected to the existing socket.

The functionality or attributes of the chip 102 or 104 may be configured by setting or configuring the signals at the configuration inputs (e.g., P0–P3) with the bond pad circuits of FIG. 1. The pre-decoder circuit 40 of FIG. 2 may be used to provide additional selection (e.g., more selections than pins) of the selected functionalities or attributes of the chip. Alternatively, the functionality or attributes of the chip may be accomplished by bond optioning at the package level (e.g., inside the chip). One may configure a set of unwired excess bond pads with the circuit of FIG. 1 to provide such selectable functionality or attributes on an internal basis. However, with such an internal configuration, post-production configuration of the chip may not be possible.

A "logic family" may comprise a plurality of parts, subsets of which have different logical functions (e.g., buffers, registers, latches, etc.). Within the family, the particular power supply voltage and the output buffer drive characteristics may be defined. These characteristics may change from family to family, as may the speed characteristics such as propagation delay.

The present invention may provide a circuit or method for controlling the functionality and/or performance attributes of an integrated circuit by providing a plurality of bonding pads that may be configured to select the desired functionality or attribute of the circuit. In one example, a set of bonding pads may produce a corresponding set of binary signals that may be decoded by the pre-decoder circuit 40. The pre-decoder circuit 40 may convert the binary signals into a corresponding number of signals that determine or control the various functions of the circuit. As a result, the present invention may allow for either (or both) pre and/or post-production configurability to select from a relatively large number of different functions or attributes in an integrated circuit.

The different functions and/or attributes of the device which may be selectable or have a selectable value including, but not limited to, the output strength, the speed of an output buffer, the noise sensitivity, whether or not the pins of the device have bus hold features, the operating voltage, the operating speed, the ground bounce/sensitivity, the number of I/Os, the number of data input and/or output pads, the directionality of data and/or address I/O (e.g., one-directional or bi-directional), whether or not the data is inverted, the number of control pins, whether some data pads are used or unused, and other functions or attributes of the device.

In one example, the circuit may be implemented as a device requiring 48 pins. If the 48-pin device is implemented on a pin package that has 56 pins, the additional eight pins may be used for selection and/or programming of the device. Four of the pins may be configured internally (i.e., during the fabrication process), while the additional four pins may be used to provide post-production configuration of the device. For example, the end user may provide the appropriate inputs to the additional four pins. While the additional user programmable inputs may add some cost to the device, the overhead associated in reducing the overall number of parts needed to be manufactured and put into inventory would generally be reduced.

In an alternate embodiment, one or more functions or attributes of the chip may be selected by a (predetermined) fuse arrangement corresponding to a particular circuit function. The fuses in the fuse arrangement can be used individually, or in combination, both to select and to prevent further modification of the desired function or attribute. When one of the plurality of circuit functions or attributes is selected, one or more first fuses in the predetermined fuse arrangement or combination may be blown to determine or configure the function or attribute. Thereafter, one or more second fuses in predetermined fuse arrangement may be blown to prevent further modification of the chip function/attribute. The fuse(s) of the "disable control lines" (i.e., the "second fuse(s)" of the predetermined fuse arrangements) that correspond to the unselected fuses are generally blown. As a result, further selection of different functions or attributes is generally disabled. A more detailed description of this alternate implementation for programming the present chip may be found in co-pending application Ser. No. 08/640,032, filed on Apr. 30, 1996, which is hereby incorporated by reference in its entirety.

The various functions of the circuit of the present invention may include a variety of functions that may each be independently varied. For example, U.S. Pat. No. 5,345,112 discloses an integrated circuit with programmable speed/power adjustment, and is hereby incorporated by reference in its entirety. The programmable integrated circuit with adjustable speed/power characteristics may have a primary current path which draws a predetermined amount of current, and/or a plurality of impedance elements which generate a reference voltage which, in turn, may control the current in the affected current path. One of a plurality of programmable switches may be coupled in series, respectively, with a corresponding one of the plurality of impedance elements, whereby each of the impedance elements can be connected or disconnected by setting its respective programmable switch, thereby adjusting the operating speed and the power consumption of the integrated circuit according to predetermined values. The programmable switch is one example of a switch that may be controlled in the present invention. As a result, the present invention may implement an integrated circuit with programmable speed and/or power.

U.S. Pat. No. 5,732,027, entitled "Memory Having Selectable Output Strength," provides another example of a circuit having selectable functions and/or attributes, and is hereby incorporated by reference in its entirety. The patented memory comprises an output buffer circuit which can have any one of multiple output buffer drive strengths. An electronic device in which such an output buffer circuit is implemented can include a mechanism for enabling the output buffer drive strength to be easily selected by a user of the memory device by an implementation of the present invention.

U.S. Pat. No. 4,877,978, entitled "Output Buffer Tri-State Noise Reduction Circuit," which is hereby incorporated by reference in its entirety, pertains to an output buffer capable of switching from an off-state to an on-state and from an on-state to an off-state without generating significant noise. The off-state and the on-state may be selected in accordance with the circuit and/or method of the present invention.

U.S. Pat. No. 4,978,905, entitled "Noise Reduction Output Buffer," which is hereby incorporated by reference in its entirety, provides a circuit for compensating for MOS device response to supply voltage variations as well as temperature and process variations in an integrated circuit.

U.S. Pat. No. 5,157,282, entitled "Programmable Output Driver for Integrated Circuits," which is hereby incorporated by reference in its entirety, provides programmable current control circuits that control the current supplied to output transistors of the device (coarse/fine, pullup/pulldown). The present invention may be used to control the programmable fine current control.

U.S. Pat. No. 5,600,267, entitled "Apparatus for Programmable CML to CMOS Translator for Power/Speed Adjustment," which is hereby incorporated by reference in its entirety, provides a CMOS circuit for translating a signal from CML to CMOS logic voltage levels. The present invention can program such a programmable circuit to an ON or an OFF state.

U.S. Pat. No. 5,153,450, entitled "Programmable Output Drive Circuit," which is hereby incorporated by reference in its entirety, provides a programmable output driver having any one of multiple drive capabilities for optimizing noise margins at different frequencies. The output driver may be programmed in a device in accordance with the present invention.

U.S. Pat. No. 5,162,672, entitled "Programmable Output Drive Circuit," which is hereby incorporated by reference in its entirety, provides a data processor having an output terminal with selectable output impedances. The data processor has at least one output terminal, the output impedance of which can vary depending on the application environment. The impedance may be selected in a device in accordance with the present invention.

While the invention has been particularly shown and described with reference to the preferred embodiments thereof, it will be understood by those skilled in the art that various changes in form and details may be made without departing from the spirit and scope of the invention.

What is claimed is:

1. A method for selecting or determining a function or attribute of an integrated circuit or chip having a plurality of selectable functions and/or attributes comprising the steps of:

adding a plurality of extra pins and/or bond pads at one or more ends of a package and/or chip; and based on a high or low voltage to each of the extra pins/pads, modifying three or more characteristics selected from the group consisting of:
(A) a drive strength of an output buffer,
(B) a threshold level of an input buffer,
(C) an operating voltage of the chip,
(D) enable/disable of a synchronous data transfer,
(E) enable/disable of a register,
(F) the speed of an output buffer,
(G) the noise sensitivity,
(H) whether or not the pins of the device have bus hold features,
(I) the operating speed,
(J) the ground bounce/sensitivity of the output buffers,
(K) the number of I/Os,
(L) the number of data input and/or output pads,
(M) the directionality of data and/or address I/Os (e.g., one-directional or bi-directional),
(N) whether or not the data is inverted,
(O) the number of control pins,
(P) whether some data pads are used or unused, and
(Q) other functions or attributes of the device.

2. A method for selecting or determining a function or attribute of an integrated circuit or chip having a plurality of selectable functions and/or attributes comprising the steps of:

modifying three or more characteristics of said integrated circuit or chip in response to one or more external voltage signals, wherein said characteristics are selected from the group consisting of:
(A) a drive strength of an output buffer,
(B) a threshold level of an input buffer,
(C) an operating voltage of the chip,
(D) enable/disable of a synchronous data transfer,
(E) enable/disable of a register,
(F) the speed of an output buffer,
(G) the noise sensitivity of the input buffers,
(H) whether or not the pins of the device have bus hold features,
(I) the operating speed,
(J) the ground bounce/sensitivity of the output buffers,
(K) the number of I/Os,
(L) the number of data input and/or output pads,
(M) the directionality of data and/or address I/Os (e.g., one-directional or bi-directional),
(N) whether or not the data is inverted,
(O) the number of control pins,
(P) whether some data pads are used or unused, and
(Q) other functions or attributes of the device.

3. The method according to claim 2, further comprising the steps of:

selecting a package having a number of extra pins;

connecting a first portion of said integrated circuit or chip having said plurality of selectable functions and/or attributes to pins of said package in accordance with a predefined pinout;

connecting a second portion of said integrated circuit or chip configured to receive said one or more external voltage signals to said extra pins of said package.

4. The method according to claim 3, wherein said extra pins are disposed at one end of said package.

5. The method according to claim 3, wherein said extra pins are disposed at a first end and a second end of said package.

6. The method according to claim 3, wherein said package comprises a dual inline package (DIP).

7. A circuit comprising:
- a first portion configured to provide any of a plurality of functions in response to one or more configuration inputs, and
- a second portion configured to generate said plurality of configuration inputs in response to one or mote external voltage signals, wherein said circuit is configured to modify, in response to said one or more configuration inputs, three or more characteristic selected from the group consisting of:
  - (A) a drive strength of an output buffer,
  - (B) a threshold level of an input buffer,
  - (C) an operating voltage of the chip,
  - (D) enable/disable of a synchronous data transfer,
  - (E) enable/disable of a register,
  - (F) the speed of an output buffer,
  - (G) the noise sensitivity,
  - (H) whether or not the pins of the device have bus hold features,
  - (I) the operating speed,
  - (J) the ground bounce/sensitivity of the output buffers,
  - (K) the number of I/Os,
  - (L) the number of data input and/or output pads,
  - (M) the directionality of data and/or address I/Os (e.g., one-directional or bi-directional),
  - (N) whether or not the data is inverted,
  - (O) the number of control pins,
  - (P) whether some data pads are used or unused; and
  - (Q) other functions or attributes of the device.

8. The circuit according to claim 7, wherein said second portion comprises a number of bond pads located on said integrated circuit.

9. The circuit according to claim 8, wherein said number of bond pads comprise one or more extra configuration bond pads for configuration disposed at the ends of the circuit.

10. The circuit according to claim 9, wherein the extra configuration bond pads are biased to a voltage on the chip such that an input buffer connected to the configuration bond pad sees a defined logical '1' or '0' state when said bond pad is unbonded.

11. The circuit according to claim 9, wherein one or more of the extra configuration bond pads are bonded to a defined logical '1' or '0' voltage within the package so as to force an input buffer connected to the pad to see a '1' or '0' irrespective of the biasing.

12. The circuit according to claim 9, wherein the extra configuration bond pads are bonded to pins on a package which are extra and are at the ends of the package.

13. The circuit according to claim 12, wherein the number of extra package pins depends on the number of different function/attributes that can be chosen.

14. The circuit according to claim 9, wherein the number of extra configuration bond pads depends on the number of different function/attributes implemented.

15. The circuit according to claim 9, wherein:
- one or more of the configuration bond pads are biased to a first state or a second state inside the package or on the chip;
- one of more of the configuration bond pads are connected to extra package pins so that an externally applied signal voltage can force a '1' or '0' on an input buffer connected to the pads.

16. The circuit according to claim 7, wherein each of said plurality of functions comprises operation as a different predefined circuit.

17. The circuit according to claim 16, wherein said different predefined circuits comprise a logic family.

18. The circuit according to claim 17, further comprising:
- a package comprising (i) a first plurality of pins configured according to a predefined pinout of said logic family and (ii) a second plurality of pins disposed so as not to affect said first plurality of pins, wherein said second plurality of pins is configured to receive said external voltage signals.

* * * * *